United States Patent
Viluan et al.

(10) Patent No.: US 7,326,025 B2
(45) Date of Patent: Feb. 5, 2008

(54) SYSTEM FOR DETECTING WARPED CARRIERS AND ASSOCIATED METHODS

(75) Inventors: Ramil A. Viluan, Baguio (PH);
Raymond M. Partosa, Baguio (PH);
Romulo D. Casallo, Jr., Baguio (PH);
Melvin B. Alviar, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 164 days.

(21) Appl. No.: 10/838,393

(22) Filed: May 4, 2004

(65) Prior Publication Data
US 2005/0247541 A1 Nov. 10, 2005

(51) Int. Cl.
*B65G 35/00* (2006.01)
(52) U.S. Cl. .......... 414/676; 198/346.1; 406/34; 406/88; 406/89; 406/198
(58) Field of Classification Search .......... 414/676; 198/346.1; 406/34, 88, 89, 184, 198
See application file for complete search history.

(56) References Cited

U.S. PATENT DOCUMENTS

| | | | | |
|---|---|---|---|---|
| 3,696,946 A * | 10/1972 | Hunter et al. | ..........  | 198/349.95 |
| 5,242,096 A * | 9/1993 | Tsunabuchi et al. | .......... | 228/9 |
| 5,414,939 A * | 5/1995 | Waugaman | .......... | 33/522 |
| 5,489,987 A * | 2/1996 | Ringlien | .......... | 356/428 |
| 5,687,209 A * | 11/1997 | Adams | .......... | 378/22 |
| 5,835,223 A * | 11/1998 | Zwemer et al. | .......... | 356/600 |
| 6,002,125 A * | 12/1999 | Schubert | .......... | 250/223 R |
| 6,256,095 B1 * | 7/2001 | Ringlien | .......... | 356/239.4 |
| 6,446,788 B1 * | 9/2002 | Leidy et al. | .......... | 198/502.4 |
| 6,650,011 B2 | 11/2003 | Partosa et al. | | |
| 6,903,814 B1 * | 6/2005 | Juvinall et al. | .......... | 356/240.1 |
| 7,021,355 B2 * | 4/2006 | Cummins et al. | .......... | 156/364 |
| 7,032,740 B2 * | 4/2006 | Hochhaus et al. | .......... | 198/502.1 |
| 7,138,596 B2 * | 11/2006 | Pippin et al. | .......... | 209/584 |

* cited by examiner

*Primary Examiner*—Joe Dillon, Jr.
(74) *Attorney, Agent, or Firm*—Wade J. Brady, III; Frederick J. Telecky, Jr.; Tum Thach

(57) ABSTRACT

Disclosed herein is a warp detection system (200) for determining warping in a carrier (110) configured to carry substrates (120) for processing. In one embodiment, the system (200) includes a guide plate (210) configured to guide a path of the carrier (110) during the processing, where the guide plate (210) is positioned underneath the carrier (110). In addition, the system (220) includes a plurality of sensors (230) positioned within the guide plate (210), wherein each of the plurality of sensors (230) is configured to measure a distance of a respective area of the carrier (110) from the guide plate (210). Also in this embodiment, the system (200) includes a processing device (310) configured to receive the measured distances and determine warping in the carrier (110) based on differences between the measured distances. Also disclosed are a method of determining warping in a carrier (110) configured to carry substrates (120) for processing, and a method of manufacturing a warp detection system (200) for determining warping in a carrier (110) configured to carry substrates (120) for processing.

8 Claims, 2 Drawing Sheets

SYSTEM FOR DETECTING WARPED CARRIERS AND ASSOCIATED METHODS

TECHNICAL FIELD

Disclosed embodiments herein relate generally to the manufacture of integrated circuit (IC) packages, and more particularly to warp detection systems, and related methods, for determining warping in a carrier configured to carry IC package substrates during processing.

BACKGROUND

In the fabrication of most semiconductor IC packages, a chip or die is mechanically and electrically connected to the leads of a package substrate prior to encapsulating the device in a protective package. Electrical contact is made between the conductive pads on the active face of the chip and external leads of the substrate. The two major pieces of automated equipment, i.e. chip and wire-bonders, used to connect the chip and substrate have many variations, but are similar in that the work stations of each apparatus must hold the device under assembly securely in place during such processing.

In the operation of a chip-bonder, a substrate is positioned onto a workstation where a semiconductor chip is adhered to the substrate. Failure to secure the substrate in a flat and horizontal position during chip mounting can cause the chip to be misplaced and/or tilted, which subsequently can lead to failures at the wire-bonding process. During other processing steps, an automated wire-bonder interconnects the input/output (I/O) pads of a semiconductor chip to specified leads on the substrate by fine wires. As with chip mounting, the substrate must be held securely in the proper position so that the chip and the leads to be bonded are properly oriented. Failure to properly hold the substrates and chips during wire-bonding often results in poorly formed bonds, broken or lifted wires.

As the manufacturing of IC packages has become more diverse and complex, the substrates are usually thinner, and thus the necessity to provide a flat, parallel surface has become more challenging. Specifically, in older technologies the substrates were rigid materials, such as ceramics or thick metal lead frames. However, in more current devices substrates often are made of a flexible film, a thin composite or laminate polymer, or a thin lead frame of malleable material, all of which commonly tend to conform to warped or otherwise misshaped carriers (or "boats") used to transport the substrates during various stages of processing. Thus, the end result of such warping by the package substrates can contribute to non-uniform bond line thickness of chip adhesives, tilted chips during chip mount, and broken or poorly formed bonds, all of which are unacceptable for reliable, high yield processing. Accordingly, what is needed are techniques and equipment for detecting such warping before crucial processing steps are performed so that appropriate action can be taken to increase yield.

BRIEF SUMMARY

Disclosed herein is a warp detection system for determining warping in a carrier configured to carry substrates for processing. In one embodiment, the system includes a guide plate configured to guide a path of the carrier during the processing, where the guide plate is positioned underneath the carrier. In addition, the system includes a plurality of sensors positioned within the guide plate, wherein each of the plurality of sensors is configured to measure a distance of a respective area of the carrier from the guide plate. Also in this embodiment, the system includes a processing device configured to receive the measured distances and determine warping in the carrier based on differences between the measured distances.

Also disclosed is a method of determining warping in a carrier configured to carry substrates for processing. In one embodiment, the method includes guiding a path of the carrier over a guide plate during the processing, and measuring a distance of a respective area of the carrier from the guide plate using a plurality of sensors positioned within the guide plate. In such embodiments, the method also includes determining warping in the carrier based on differences between the measured distances.

Additionally disclosed is a method of manufacturing a warp detection system for determining warping in a carrier configured to carry substrates for processing. In one embodiment, the method includes providing a guide plate configured to guide a path of the carrier during the processing, where the guide plate is positioned underneath the carrier. In addition, in this embodiment, the method includes locating a plurality of sensors within the guide plate, where each of the plurality of sensors is configured to measure a distance of a respective area of the carrier from the guide plate. Furthermore, the method includes providing a processing device configured to receive the measured distances and determine warping in the carrier based on differences between the measured distances.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF PREFERRED EMBODIMENTS

Figure 1:
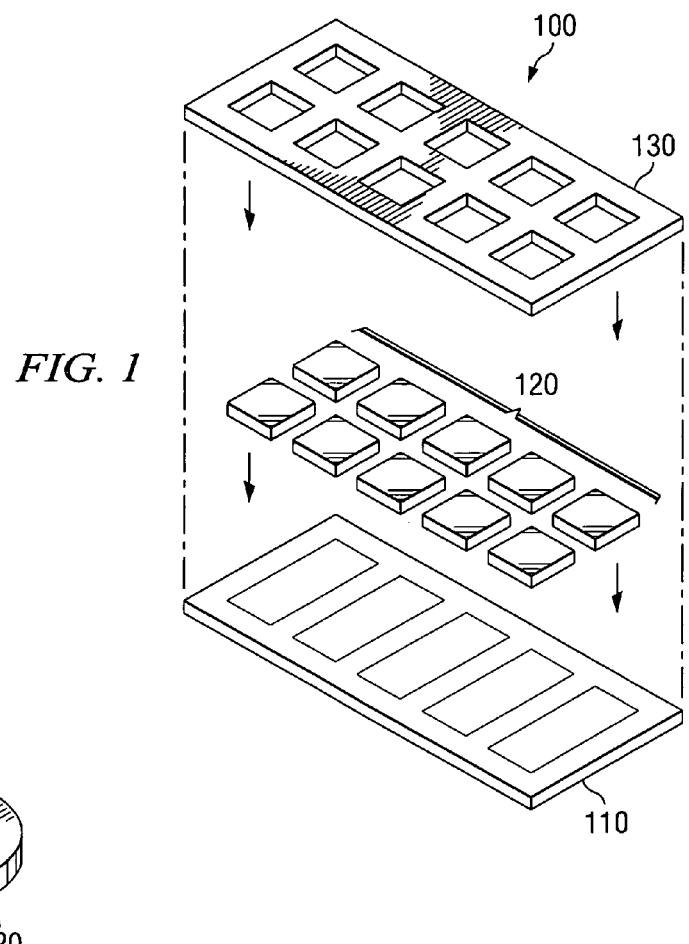
FIG. 1 illustrates one embodiment of a carrier assembly that is tested for warping by a system or method as disclosed herein.

Referring initially to FIG. 1, illustrated is one embodiment of a carrier assembly 100 that is tested for warping by a system or method as disclosed herein. More specifically, the carrier assembly 100 includes a substrate carrier 110 or "boat" that is configured to carry substrates employed in integrated circuit (IC) manufacturing during various processing steps. For example, embodiments discussed herein envision the carrier assembly 100 being checked within a gBGA (generic ball grid array) Package Mounter, which may be employed to mount package substrates on carriers prior to die attachment or to mount finished substrates into a tray after potting materials have cured. Typically, such carriers 110 are composed of T6 aluminum to provide strength and rigidity while carrying substrates, however the systems and methods disclosed herein are not limited to any particular type of carrier 110.

Also shown in FIG. 1 is a group of package substrates (collectively labeled 120). In an exemplary embodiment, the package substrates 120 are IC package substrates 120 that are carried by the carrier 110 and on which IC chips or other circuitry is mounted and wired using, for example, conventional wire-bonding techniques. Such package substrates 120 may then be further processed by creating a ball grid array on an underside thereof for mounting to other substrates or circuit boards using, for example, "flip-chip" techniques. Further illustrated is a clip frame 130, used to secure the substrates 120 in a specific desired position on the carrier 110 when the clip frame 130 is fastened to the carrier 110. The clip frame 130 may be made from spring steel, but any type of clip frame 130 may be employed.

Unfortunately, even when using a clip frame 130 to secure the position of the substrates during further processing, if the carrier assembly 100 is not substantially flat and square, problems during the later stages of processing the substrates 120 may occur. For example, if the carrier 110 is significantly warped in any direction, the orientation of the substrates 120 riding thereon may be skewed so as to interfere with later processing steps. Typically, for instance, the warped state of the carrier 110 can interfere with the wire-bonding process used to electrically connect the mounted IC chip, resulting in a faulty end product. In other cases, such warping may interfere with properly laying out a BGA on the package substrate for use later in mounting the package. In many cases, the warping of the carrier 110 may have developed during earlier processing steps on the substrates 120 or even during its own manufacture.

Figure 2:
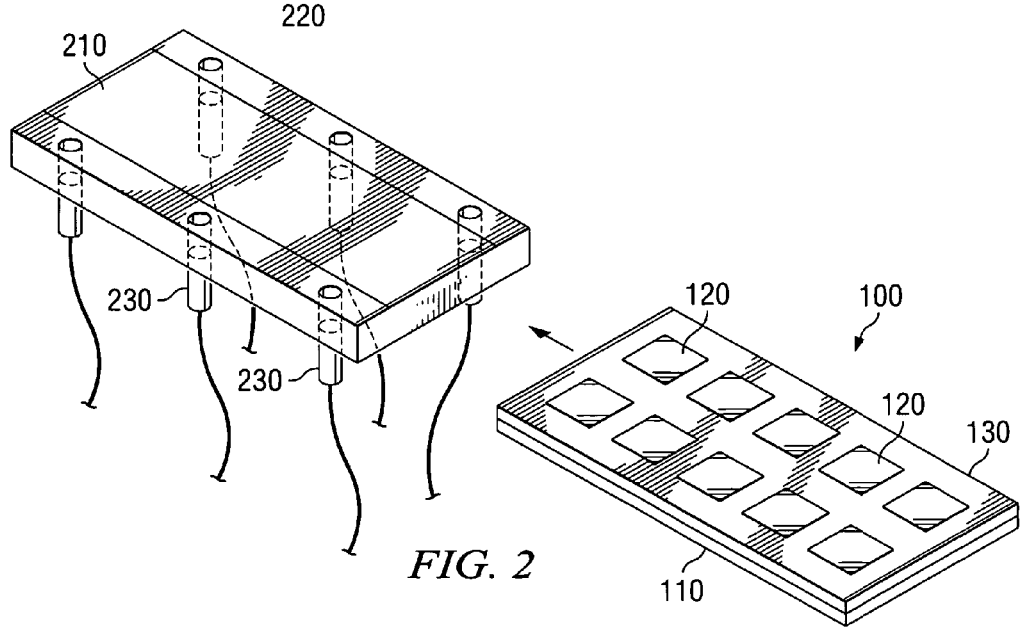
FIG. 2 illustrates one embodiment of a warp detection system according to the principles disclosed herein for determining the presence of any warping in a substrate carrier.

Turing now to FIG. 2, illustrated is one embodiment of a warp detection system 200 according to the principles disclosed herein for determining the presence of warping in a substrate carrier. In the illustrated embodiment, the system 200 includes the carrier assembly 100 discussed with respect to FIG. 1 undergoing a check for the presence of any warping. Of course, other embodiments of the system 200 are envisioned, all of which fall within the broad scope of this disclosure. For example, although discussed in terms of carriers for carrying IC package substrates, the disclosed systems and methods may also be employed with any other type of carrier or boat that may benefit from warp detection. Moreover, the system 200 may be employed within a gBGA Package Mounter, such as the type described above in greater detail.

The system 200 also includes a guide plate 210. In accordance with conventional processing equipment, the guide plate 210 may be located in the workspace of the Package Mounter, or any apparatus configured for other types of processing. As its name suggests, the guide plate 210 is typically designed and constructed to guide the carrier assembly 100 into such workspace. Moreover, the guide plate 210 may be further configured to provide a sturdy platform for the carrier assembly 100 during any mounting/processing steps conducted. In addition, such processing steps may be conducted using a processing head or "jig" 220. In accordance with the mounting/processing of the substrates 120 discussed above, the jig 220 may be configured to include any type of tooling for mounting/processing the substrates 120, or even configured to hold multiple tooling capable of multiple processing steps. For example, the jig 220 may include tooling for adhering IC chips onto the substrates 120, then further tooling for performing wire-bonding between the mounted IC chips and the interconnects of the substrates 120, and then further tooling for creating a BGA on the substrate package.

Also included in the illustrated system 200 is a group of sensors (one of which is labeled 230) located within the side areas of the guide plate 210. In accordance with the principles disclosed herein, these sensors 230 are employed to determine the presence of warping in the carrier 110 so that the results of further processing of the substrates 120 are more accurate. In this specific embodiment, the system 200 includes six sensors 230, however any number of sensors 230 may be employed. In function, when the carrier assembly 100 is positioned over the guide plate 210, the sensors 230 are activated in order to measure a distance from the guide plate 210 to areas of the carrier 110 corresponding to the locations of each sensor 230.

In an advantageous embodiment, the sensors 230 are height sensors that are operated to determine the height of various areas of the bottom of the carrier 110 (typically corresponding to each location of the sensors 230) from a perpendicular direction to the guide plate 210. Moreover, in some embodiments, the locations of the sensors 230 with respect to the carrier 110 are specifically selected so that distance measurements for very specific locations are made. For example, in many embodiments where the carrier 110 has a rectangular shape, six sensors 230 may be employed. More specifically, as in the illustrated embodiment, four of the sensors 230 are each positioned to measure corresponding distances proximate to each of the corners of the carrier 110. Additionally, the remaining two sensors 230 are positioned to measure corresponding distances proximate to the longitudinal center of the carrier 110. Furthermore, a system constructed and operated according to the principles disclosed herein is typically configured to measure these distances as the carrier 110 is stationary over the guide plate 210, however measurements taken while the carrier 110 moves across the guide plate 210 are also envisioned and encompassed herein.

Figure 3:
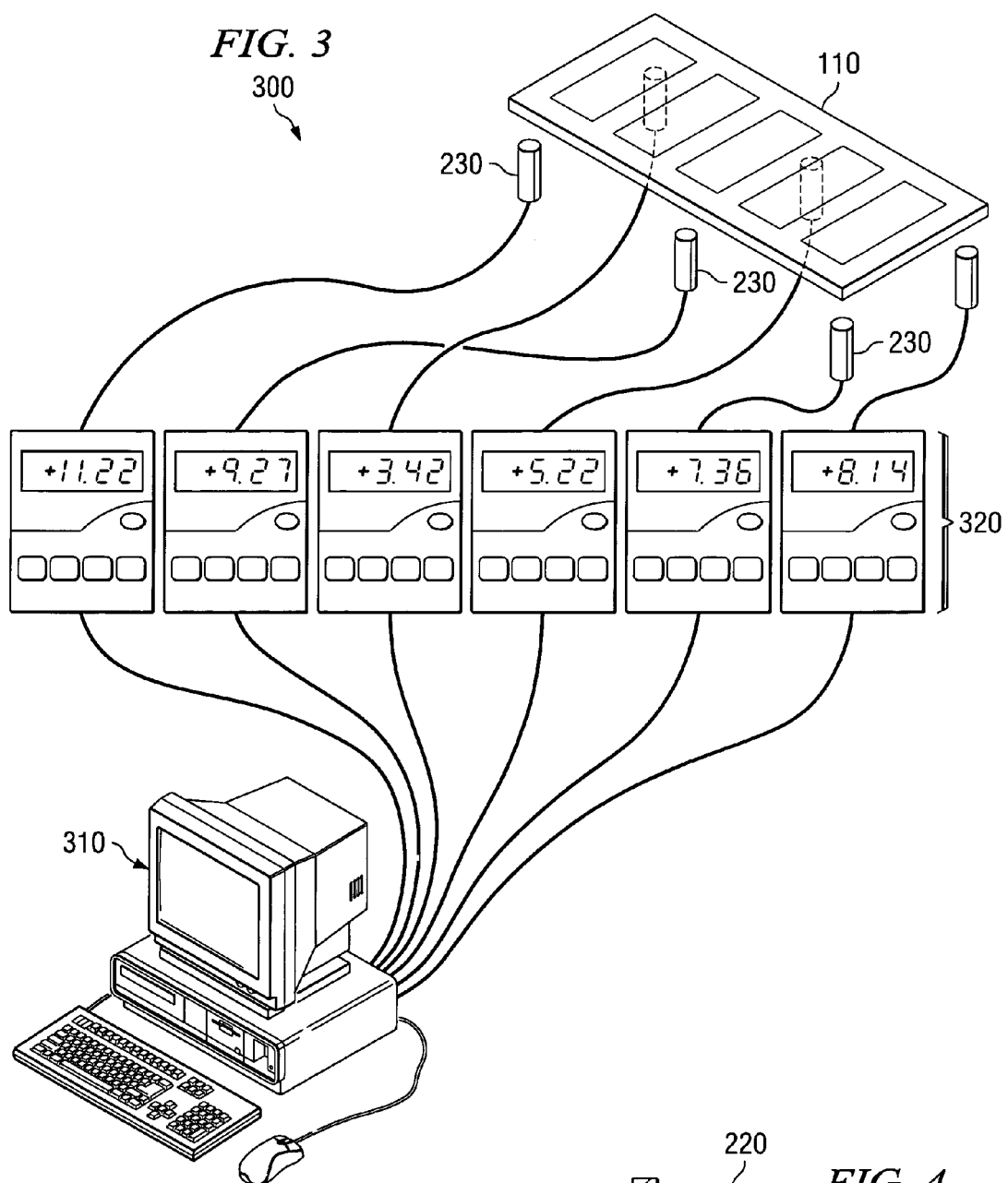
FIG. 3 illustrates another embodiment of a warp detection system constructed and operated according to the principles disclosed herein.

Looking now at FIG. 3, illustrated is another embodiment of a warp detection system 300 constructed and operated according to the principles disclosed herein. In this embodiment, the system 300 still includes the carrier 110 discussed with respect to FIGS. 1 and 2, however the other portions of the carrier assembly 100 have been removed from this view for easier visibility. Moreover, the carrier 110 is illustrated as partially translucent, again simply for clarity of discussion.

Also illustrated in this embodiment is the group of sensors 230 discussed above with reference to FIG. 2. The guide plate 210 has been removed from this illustration of the system 300 so as to more clearly illustrate the positions of the sensors 230 with respect to the carrier 110. As such, four of the sensors 230 are each positioned to measure corresponding distances below the corners of the carrier 110, while two sensors 230 are positioned to measure corresponding distances below the center of the carrier 110, proximate to its edges. The distance measurements taken from the various designated locations on the carrier 110 to the guide plate 210 are then fed into a processing device 310 configured to receive the measurements and determine whether any warping in the carrier 110 is present.

Specifically, the distances may first be precisely measured and displayed using a group of readouts 320 coupled to the processing device 310. Additionally, a single readout 320 may be separately connected to each corresponding one of the sensors 230, as in the illustrated embodiment. In such an embodiment, the readouts 320 not only work with their individual sensors 230 to measure the distances, but may also include a display screen, such as a digital display, for displaying the determined measurements to a user of the system 300. Next, the measurements are transmitted to the processing device 310, which in many embodiments may simply be a computer or computer system. The computer 310 is then employed to determine differences among the measurements taken between the various areas of the carrier 110 and the guide plate 210 (or other reference point).

If the carrier 110 is substantially straight (i.e., substantially free of warping), each of the distances from the various points of the carrier 110 to the reference point will typically be substantially equal to each other. However, if certain areas of the carrier 110 are warped, for instance, if the entire left end of the carrier 110 is warped away from the guide plate 210, sensors 230 corresponding to that end of the carrier 110 will measure larger distances than other sensors 230 that correspond to straight portions of the carrier 110. Similarly, if the center of the carrier 110 is bowed away from the guide plate 210, the sensors 230 measuring the longitudinal center of the carrier 110 will find a greater distance from the reference point than the sensors 230 associated with the corners of the carrier 130. And in another example, if the warping present in the carrier 110 has occurred from the structure of the carrier 110 twisting, the sensors 230 located cross-corner from each other will typically measure similar distances, while adjacent sensors 230 will not. In any of these cases, the computer 310 (or even the readouts 320 themselves) may include a tolerance value for the differences in distance measurements, and notify a user if any of the measured distances exceed that tolerance value. The carrier 110 may then be rejected and replaced (or possible repaired). In yet other embodiments, later processing steps on the packages may be adjusted to compensate for any warping detected in the carrier 110.

Figure 4:
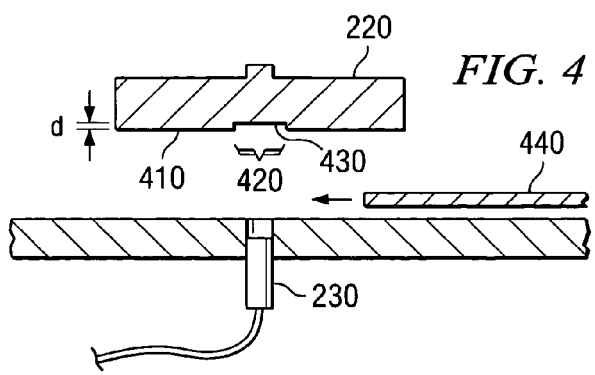
FIG. 4 illustrates the calibration of the sensors discussed with respect to the system illustrated in FIG. 2.

Turning finally to FIG. 4, illustrated is the calibration of the sensors 230 discussed with respect to the system 200 illustrated in FIG. 2. More specifically, now visible in the system 300 is a calibration surface 410 on the jig 220, which may be employed to calibrate the sensors 230 prior to measuring any distances from actual substrate carriers 110. By calibrating the sensors 230 initially, more accurate measurements on actual carriers 110 may be obtained.

With this calibration approach, the calibration surface 410 is a smooth, flat surface on the jig 220 that is oriented towards the reading tips of the sensors 230. Also, the calibration surface 410 has typically undergone surface grinding (usually during manufacture of the jig 220) to create an extremely flat finish. Those who are familiar with surface grinding understand the precise finish that is available with such a technique. Thus, since the calibration surface 410 has been ground to a precise, flat finish surface, distances between the calibration surface 410 and the reference point (e.g., points on the bottom of the guide plate 210) as measured by all of the sensors 230 should be substantially equal, thus allowing the sensors 230 to be calibrated to that surface 410. Moreover, in embodiments employing readouts 320 (see FIG. 3) corresponding to the sensors 230, the readouts 320 may each incorporate adjustment inputs for adjusting the measurement made by its corresponding sensor 230 in order to accomplish the calibration.

In a related embodiment, the calibration surface 410 also includes a recessed gap 420. In such embodiments, the group of sensors may be configured to measure a distance of the ground calibrating surface 410 and then measure a distance of the recessed gap 420, both from the guide plate 210 or other reference point, to accomplish the calibrating. When the recessed gap 420 has also been precisely ground along with the calibration surface 410, the gap 420 has a recessed surface 430 at a very precise and predetermined depth (denoted as "d") below the surface of the calibration surface 410 (e.g., 0.05 mm). As such, by measuring both surfaces 410, 430 with the sensors 230, each sensor 230 may be calibrated based on the known predetermined depth d of the recessed gap 420 below the calibration surface 410. As before, adjustments to the measurements taken by the sensors 230 may be made using corresponding readouts 320, if present, or may be made in the computer device 310.

In yet another embodiment, a calibration carrier 440 (shown in broken line) may be used in place of (or with) the calibration surface 410. In such embodiments, the calibration carrier 440 has either been previously examined and determined to be free of significant warping (or within a given tolerance), or has been carefully manufactured to be warp-free. In either case, the underside of the calibration carrier 440 provides the calibration surface, and the group of sensors 230 may be configured to measure distances from various points on the underside of the calibration carrier 440 to accomplish the calibrating. Of course, other embodiments of the systems and methods disclosed herein may employ any type of calibration device, removable or fixed, and is not limited to being a carrier. Also, while the rough surface often found on the materials used to form the substrate carriers as compared to the smooth surface of a grinded calibration surface may result in different calibration measurements when compared to each other, either may be employed in a calibration technique as described herein with substantially equal success.

While various embodiments of systems and methods for determining warping in a substrate carrier, and for constructing such a system, have been described above, it should be understood that they have been presented by way of example only, and not limitation. Thus, the breadth and scope of the invention(s) should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A warp detection system for determining warping in a moving carrier configured to carry substrates for processing, the system comprising:
   a guide plate configured to guide a path of the moving carrier during the processing, the guide plate positioned underneath the moving carrier;
   a plurality of sensors positioned within the guide plate comprising:
      a first plurality of sensors configured to measure a distance of a respective area of the moving carrier from the guide plate;
      a second plurality of sensors configured to measure the height of a respective area of the moving carrier; and
      a processing device configured to receive the measured distances and determine warping in the moving carrier based on differences between the measured distances.

2. A system according to claim 1, wherein the second plurality of sensors measure the height of various areas of the bottom of the moving carrier from a perpendicular direction to the guide plate.

3. A system according to claim 1, wherein the movable carrier is rectangular and the first plurality of sensors comprises sensors positioned to measure a distance proximate each corner of the movable carrier.

4. A system according to claim 3, wherein the first plurality of sensors further comprises sensors positioned to measure a distance proximate a longitudinal center of the movable carrier.

5. A system according to claim 1, further comprising a jig wherein the plurality of sensors are calibrated with said jig having a calibration surface oriented towards the guide plate for calibrating the plurality of sensors.

6. A system according to claim 5, wherein the calibration surface comprises a recessed gap, the first and second pluralities of sensors further configured to measure a distance of the calibration surface and a distance of the recessed gap from the guide plate to accomplish the calibrating.

7. A system according to claim 1, further comprising a calibration carrier predetermined to be substantially free of warping and having a calibration surface oriented towards the guide plate for calibrating the first and second pluralities of sensors.

8. A system according to claim 1, wherein the plurality of sensors is configured to measure a distance of a respective area of the movable carrier from the guide plate as the movable carrier is movable across the guide plate.

* * * * *